(12) United States Patent
Sakamoto

(10) Patent No.: US 8,072,068 B2
(45) Date of Patent: Dec. 6, 2011

(54) SEMICONDUCTOR DEVICE AND A METHOD FOR MANUFACTURING THE SAME

(75) Inventor: Tatsuya Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/469,636

(22) Filed: May 20, 2009

(65) Prior Publication Data

US 2009/0289364 A1   Nov. 26, 2009

(30) Foreign Application Priority Data

May 21, 2008   (JP) ................................ 2008-133391

(51) Int. Cl.
*H01L 23/498* (2006.01)
*H01L 21/28* (2006.01)

(52) U.S. Cl. . 257/737; 257/738; 257/762; 257/E23.068; 257/E23.07; 257/E23.072; 257/E21.158; 438/652

(58) Field of Classification Search .................. 257/738, 257/762, E23.07, E23.072, E23.068, 737, 257/E21.158; 438/652

See application file for complete search history.

(56) References Cited

U.S. PATENT DOCUMENTS

| 6,034,437 | A  | * | 3/2000 | Shibata | 257/783 |
| 6,198,169 | B1 | * | 3/2001 | Kobayashi et al. | 257/780 |
| 6,458,622 | B1 | * | 10/2002 | Keser et al. | 438/106 |
| 2002/0151164 | A1 | * | 10/2002 | Jiang et al. | 438/613 |
| 2002/0175409 | A1 | * | 11/2002 | Tsubosaki | 257/737 |
| 2003/0071352 | A1 | * | 4/2003 | Ohuchi et al. | 257/737 |
| 2003/0092219 | A1 | * | 5/2003 | Ohuchi et al. | 438/110 |
| 2003/0214795 | A1 | * | 11/2003 | Sakuyama | 361/767 |
| 2006/0014320 | A1 | * | 1/2006 | Yamano et al. | 438/113 |
| 2007/0249093 | A1 | * | 10/2007 | Aiba et al. | 438/108 |
| 2008/0128917 | A1 | * | 6/2008 | Yamano | 257/778 |

FOREIGN PATENT DOCUMENTS

JP   2003-031768   1/2003

* cited by examiner

*Primary Examiner* — Eugene Lee
*Assistant Examiner* — Peniel M Gumedzoe
(74) *Attorney, Agent, or Firm* — Rabin & Berdo, P.C.

(57) ABSTRACT

A semiconductor device according to the present invention includes: a semiconductor chip; a sealing resin layer formed on the semiconductor chip; and a post electrode formed in a through-hole penetrating through the sealing resin layer in a thickness direction, and having a hemispheric top surface.

76 Claims, 3 Drawing Sheets

US 8,072,068 B2

SEMICONDUCTOR DEVICE AND A METHOD FOR MANUFACTURING THE SAME

BACKGROUND OF THE INVENTION

1. Field of the Invention

The present invention relates to a semiconductor device applying WLCSP (Wafer Level Chip Size Package) technology and a method for manufacturing the semiconductor device.

2. Description of Related Art

Practical use of WLCSP technology is progressing these days, as a semiconductor device becomes highly efficient and multifunctional. At the semiconductor device applying WLCSP technology, a packaging process is completed in a wafer state including many chips, and a size of each individual chips cut out by dicing becomes a package size.

The semiconductor device applying WLCSP technology, as shown in FIG. 4, includes a semiconductor chip 101, a passivation film 102 covering the surface of the semiconductor chip 101, a polyimide layer 103 formed on the passivation film 102, a rewiring 104 formed on the polyimide layer 103, a sealing resin layer 105 formed on the polyimide layer 103 and the rewiring 104, and a solder ball 106 arranged on the sealing resin layer 105.

In the passivation layer 102, an opening 108 is formed so as to expose a part of an internal wiring of the semiconductor chip 101 as the pad electrode 107. The rewiring 104 is connected to the pad electrode 107 through the through-hole 109 formed so as to penetrate the polyimide layer 103. The rewiring 104 is connected to the solder ball 106 through a post electrode 110 penetrating the sealing resin layer 105. Mounting of this semiconductor device on the print circuit board (electrical and mechanical connection between this semiconductor device and the print circuit board) is accomplished by connecting each of the solder balls 106 to the pad electrode of the print circuit board.

In process of manufacturing the semiconductor device, a semiconductor substrate as a sum of the semiconductor chips is prepared at first. Then the polyimide layer 103 and the rewiring 104 are formed on the passivation film 102 covering the surface of the semiconductor substrate. Then the post electrode 110 is formed on the rewiring 104 at a predetermined position by plating method or the like. Then an epoxy resin, a material of the sealing resin layer 105, is supplied so as to bury the post electrode 110 on the polyimide layer 103 and the rewiring 104.

After the epoxy resin is cured, a surface of the epoxy resin is ground by the grinder and the top surface of the post electrode 110 is exposed from the epoxy resin. Then the solder ball 106 is arranged on the top surface of the post electrode 110. After then, the semiconductor substrate is cut (diced) along a predetermined dicing-line between each semiconductor chip with the passivation film 102 and the sealing resin layer 105. As a result, the semiconductor device shown in FIG. 4 is obtained.

However, the epoxy resin is ground until the top edge face of the post electrode 110 is exposed from the epoxy resin, hence the top surface of the post electrode 110 becomes flush with the surface of the epoxy resin 105 after the grinding process. Therefore, in the cross section orthogonal to the surface of the semiconductor 101, the post electrode 110 includes a corner portion 111 which consists of the top surface and a side surface orthogonal to the top surface. Therefore, due to the post electrode 110 including such a corner portion 111, in the state in which the solder ball 106 is connected to the pad electrode of the print circuit board, the solder ball 106 is intensively received stress from the corner portion 111. By the intensive stress, a crack may form in the solder ball 106.

SUMMARY OF THE INVENTION

An object of the present invention is to provide a semiconductor device and a method for manufacturing the semiconductor device with which crack formation by the intensive stress in an external connecting terminal can be prevented.

A semiconductor device according to one aspect of the present invention includes: a semiconductor chip; a sealing resin layer formed on the semiconductor chip; and a post electrode formed in a through-hole penetrating through the sealing resin layer in a thickness direction, and having a hemispheric top surface.

According to this structure, the through-hole is formed so as to penetrate through the sealing resin layer laminated on the semiconductor chip in the thickness direction. The top surface of the post electrode is formed into a hemispheric shape and has no corner portion.

Therefore, the external connecting terminal arranged on the top surface of the post electrode is not received an intensive stress from the post electrode. Consequently, crack formation by the intensive stress in the external connecting terminal can be prevented.

Additionally, as an interface between the external connecting terminal and the post electrode is formed into a hemispheric shape, a strength of withstanding the stress in a lateral direction (a direction which vertically across against the facing direction between the solder ball and the surface of the post electrode) between the external connecting terminal and the post electrode is increased, compared to the structure in which an interface between the external connecting terminal and the post electrode is a plane.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
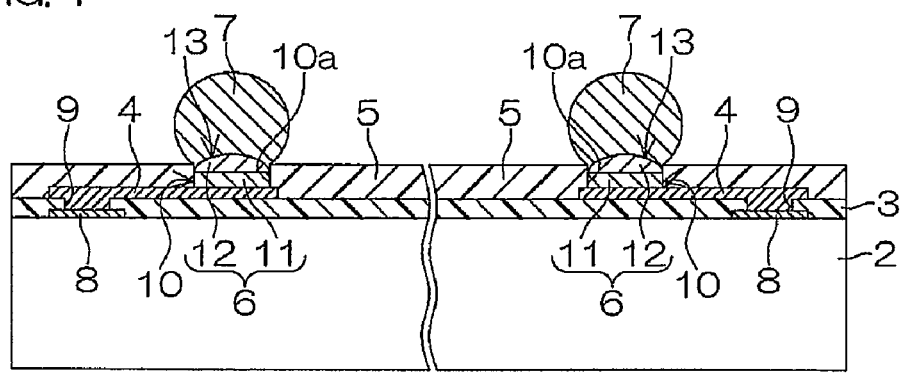
FIG. 1 is a schematic sectional view of a semiconductor device according to an embodiment of the present invention.

FIG. 1 is a schematic sectional view of a semiconductor device according to an embodiment of the present invention.

A WLCSP technology is applied in the semiconductor device 1. The semiconductor device 1 includes a semiconductor chip 2, a passivation film (surface protecting film) 3 covering the surface(a surface formed with functional elements) of the semiconductor chip 2, a plurality of rewirings 4 formed on the passivation film 3, a sealing resin layer 5 formed on the passivation film 3, a post electrode 6 formed on each of the rewirings 4 and penetrating through the sealing resin layer 5, and metal solder balls 7 as an external connecting terminal arranged on top surfaces of the post electrodes 6 respectively.

The semiconductor chip 2 is, for example, a silicon chip. The semiconductor chip 2 is formed into a quadrilateral shape in a plan view.

The passivation film 3 is made, for example, of silicon oxide or silicon nitride. A plurality of openings 9 are formed on the passivation film 3 so as to expose parts of internal wirings connected to the functional elements as a pad electrodes 8.

The rewirings 4 are made, for example, of a metal material such as copper. Each of the rewirings 4 is extending onto the surface of the passivation film 3 from the pad electrode 8 through the opening 9 and is extending along the surface of the passivation film 3.

The sealing resin layer 5 is made, for example, of an epoxy resin. The passivation film 3 and the rewirings 4 are covered and sealed with the sealing resin layer 5. The surface of the sealing resin layer 5 is formed into a plane. The side face of the sealing resin layer 5 is formed flush with the side face of the semiconductor chip 2.

Therefore, outline size (package size) of the semiconductor device 1 is as large as the semiconductor chip 2 in a plan view. Furthermore, a through-hole 10 having a cylindrical inner surface 10a is formed on a top edge portion of each of the rewirings 4 so as to penetrate through the sealing resin layer 5 in the direction of the thickness thereof.

Figure 2:
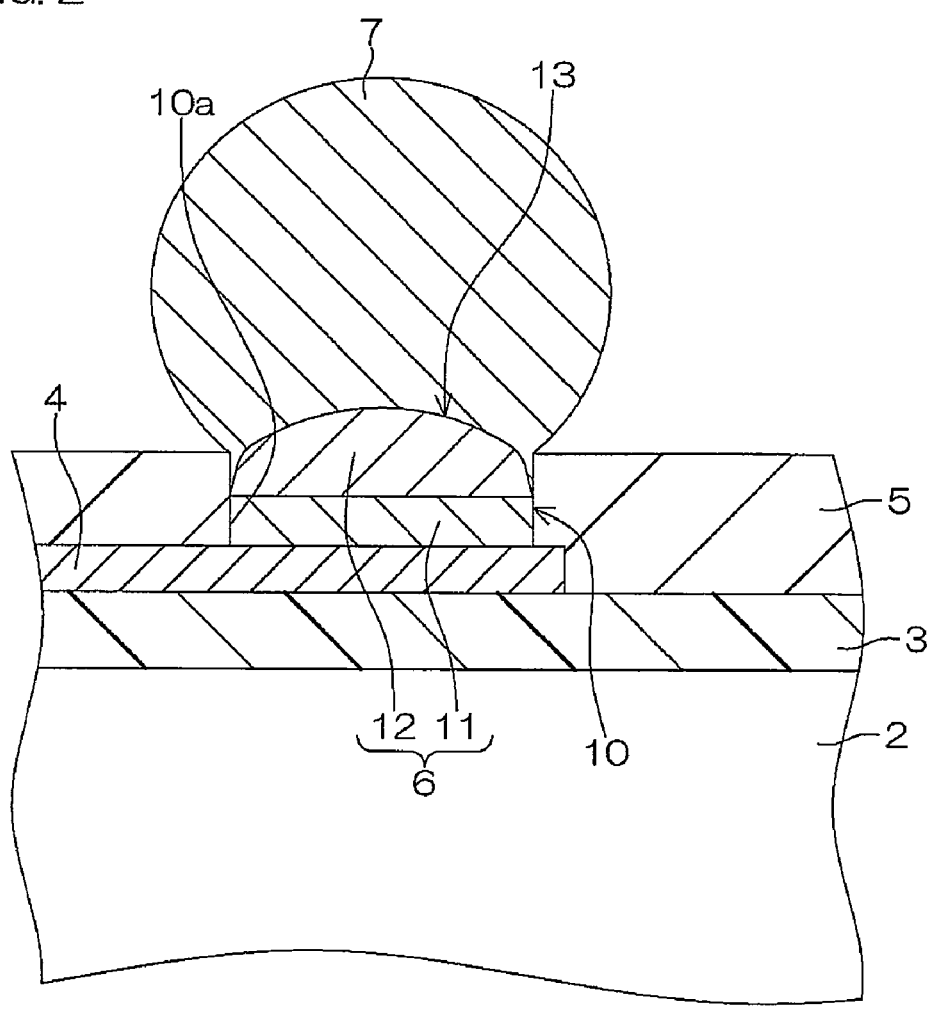
FIG. 2 is a schematic sectional view around a post electrode.

FIG. 2 is a schematic sectional view around the post electrode.

The post electrode 6 is formed in each of the through-holes 10. The base edge of the post electrode 6 is connected to the rewiring 4. The top edge of the post electrode 6 slightly protrudes from the surface of the sealing resin layer 5.

Concretely, the post electrode 6 comprises a base portion 11 formed on the rewiring 4 and a top edge portion 12 formed on the base portion 11 integrally.

The base portion 11 is made of copper as a first metal material. The base portion 11 is formed as a columnar shape. The base portion 11 is buried in the through-hole 10 formed in the sealing resin layer 5. An interface between the base portion 11 and the top edge portion 12 is positioned at the side of the semiconductor chip 2 with respect to the surface of the sealing resin layer 5.

The top edge portion 12 is made of tin as a second metal material. A center portion of the edge portion 12 is formed into a hemispheric shape which swells compared to a circumferential portion thereof.

Thus, a surface 13 of the top edge portion 12 is formed into a hemispheric shape as the top surface 13 of the post electrode 6. The top portion (central portion) of the top surface face 13 protrudes from the surface of the sealing resin layer 5. The circumferential portion of the top edge portion 12 is positioned at the side of the semiconductor chip 2 with respect to the surface of the sealing resin layer 5. Therefore, at above of the base portion 11, the inner surface 10a of the through-hole 10 is exposed, a gap is generated between the inner surface 10a and the top surface 13.

Figure 4:
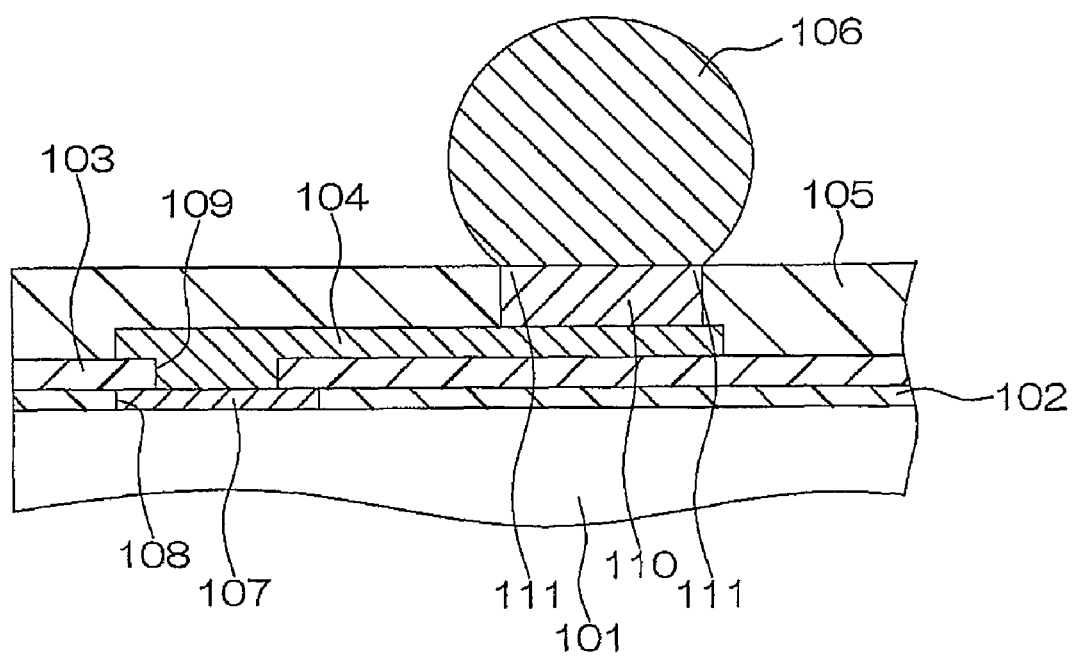
FIG. 4 is a schematic sectional view showing a construction according to a conventional semiconductor device.

The metal ball 7 as the external connecting terminal is made of solder. The metal ball 7 is formed into a ball shape protruding from the surface of the sealing resin layer 5. The base edge portion of the metal ball 7 enters the gap between the inner face 10a of the through-hole 10 and the top surface 13 of the post electrode 6. The base edge portion of the metal ball 7 is sandwiched between the inner face 10a of the through-hole 10 and the top edge face 13 of the post electrode 6. As shown in FIG. 2 (see also FIG. 4), and described further below, a maximum diameter of metal ball 7 is smaller than a length which is 1.3 times the diameter of the post electrode 6 or a length of a chord corresponding to an arc formed by the curving top surface 13, and a diameter of the base portion 11 and a diameter of the top edge portion 12 at the contact surface between them are the same size.

Mounting of the semiconductor device 1 on the print circuit board (electrical and mechanical connection between the semiconductor device 1 and the print circuit board) is accomplished by connecting each of the metal balls to the pad electrode of the print circuit board.

FIGS. 3A to 3E are schematic sectional views showing a semiconductor device in process of manufacturing the semiconductor.

Manufacturing the semiconductor device 1 proceeds in a wafer state before each piece of the semiconductor chip 2 is cut out by dicing. The surface of the semiconductor chip 2 (semiconductor substrate) is covered with the passivation film 3.

Figure 3A:
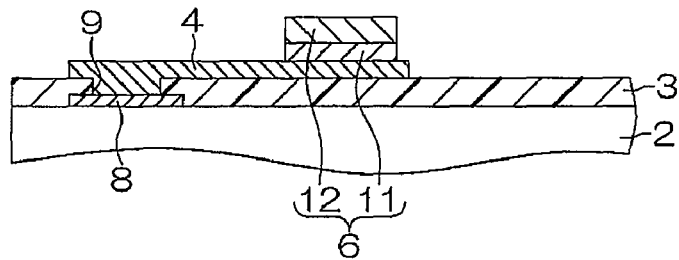
FIG. 3A is a schematic sectional view showing a state in the process of manufacturing the semiconductor device.

First, as shown in FIG. 3A, a plurality of opening pads 9 are formed in the passivation film 3 by photolithography and etching. Then, a plating layer made of the material of the rewirings 4 is formed on the passivation film 3 and the pad electrodes 8 exposed from the pad openings 9. The plating layer is patterned into a plurality of rewirings 4 by photolithography and etching. Thereafter, the post electrode 6 is formed on each of the rewirings 4.

The post electrode 6 is formed, for example, by forming a mask with a opening correspond to the portion where the post electrode 6 should be formed on the passivation 3 and the rewirings 4, then depositing copper, a material of the base part 11, and tin, a material of the top edge portion 12, in the opening at the mask by plating successively, and then removing the mask.

Furthermore, the post electrode 6 is also formed by forming a laminated metal layer film (not shown in figure), and then removing the laminated metal layer film by photolithography and etching selectively. The laminated metal layer is formed by depositing the copper and tin on the passivation film 3 and the rewirings 4 by plating successively. Copper is the same as the material of the base part 11. Tin is the same as the material of the top edge portion 12.

Figure 3B:
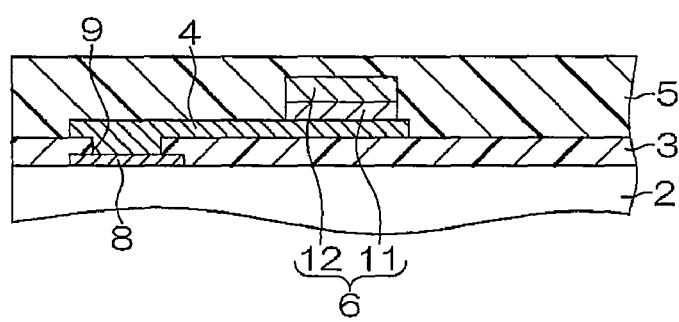
FIG. 3B is a schematic sectional view of a step subsequent to that of FIG. 3A.
Figure 3C:
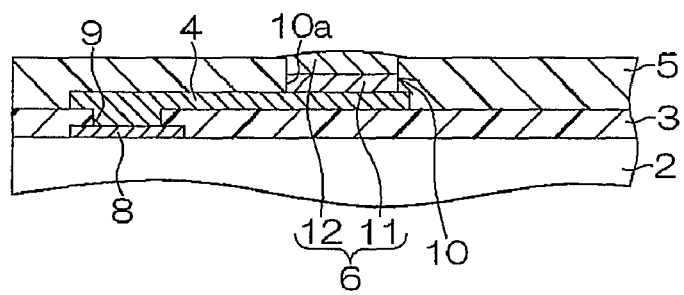
FIG. 3C is a schematic sectional view of a step subsequent to that of FIG. 3B.

Then, as shown in FIG. 3B, a resin (a epoxy resin for example), a material of the sealing resin layer 5, is supplied on the passivation film 3 so as to bury the post electrode 6. After the resin is cured, the surface of the resin (sealing resin layer 5) is ground by grinder. Then, as shown in FIG. 3C, the top surface of the top edge portion 12 is exposed from the sealing resin layer 5. At this moment, tin, the material of the top edge portion 12, is spread around the through-hole 10 on the surface of the sealing resin layer 5 with the grinder due to the ductility of tin.

Figure 3D:
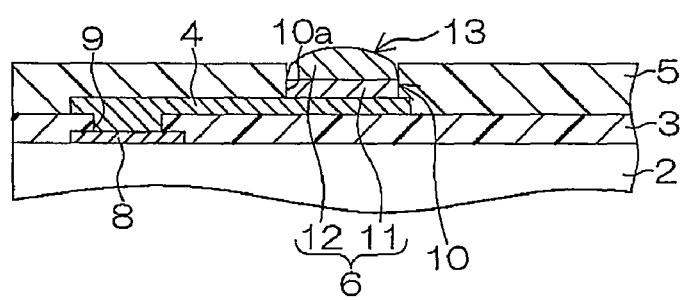
FIG. 3D is a schematic sectional view of a step subsequent to that of FIG. 3C.

Then, a heating process is carried out. In this heating process, a structure on the semiconductor chip 2 (the wafer) is heated with whole of the semiconductor chip 2. In this process, heating temperature is adjusted higher than the melting point of tin (232° C.) used for the top edge portion 12, and is adjusted lower than the melting point of the copper (1084° C.) used for the base portion 11. Thus, tin, the material of the base portion 12, becomes molten. Molten solution of the tin becomes a hemisphere shape by surface tension thereof. After the heating process, melting solution of the tin solidifies with the hemisphere shape, hence the top edge portion 12 becomes the hemisphere shape as shown in FIG. 3D.

Figure 3E:
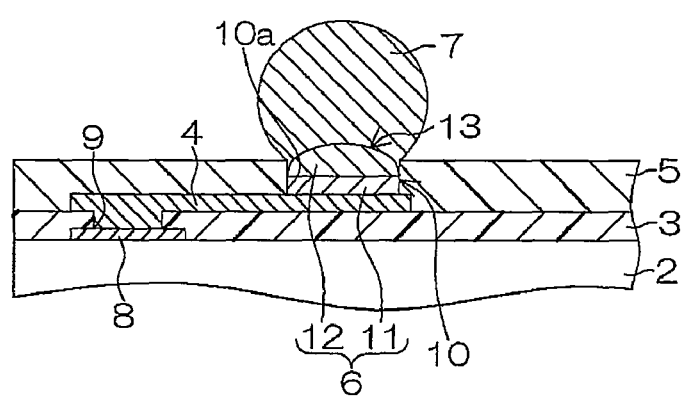
FIG. 3E is a schematic sectional view of a step subsequent to that of FIG. 3D.

After that, as shown in FIG. 3E, metal balls 7 are formed on the top edge face 13 of the post electrodes 6 (top edge portion 12). Then, the semiconductor device 1 is obtained by dicing the wafer (semiconductor substrate) to each of the semiconductors 2.

As mentioned above, the through-hole 10 is formed so as to penetrate through the sealing resin layer on the semiconductor chip 2 in the thickness direction. The post electrode 6 is formed in the through-hole 10.

The top surface 13 of the post electrode 6 is formed into a hemispheric shape without having a corner portion. Therefore, intensive stress, from the post electrode 6 to the metal ball 7 formed on the top edge portion 13 of the post electrode 6, is avoided.

Consequently, crack formation by the intensive stress from the post electrode 6 in the metal ball 7 is avoided. Furthermore, the interface between the metal ball 7 and the post electrode 6 is formed into a hemispheric shape, the connecting strength against the stress in a lateral direction (a direction which vertically across against the facing direction between the metal ball 7 and the post electrode 6) is improved, compared to construction which an interface between the metal ball 7 and the post electrode 6 is formed plane.

Also, side face of the base portion 11 is covered by the sealing resin layer 5 so as not to expose. Therefore, oxide film (copper oxide film) will not be formed on the surface of the base portion 11.

Furthermore, the inner surface 10a of the through-hole 10 is exposed at above the base portion 11, the gap is formed between the inner surface 10a of the through-hole 10 and the top surface 13 of the top edge portion 12 (post electrode 6). The metal ball 7 formed on the top edge portion 12 enters the gap, the metal ball 7 is hold tight between the inner surface 10a of the through-hole 10 and the top surface 13 of the top edge portion 12. As a result, connecting strength between the metal ball 7 and the post electrode 6 is improved.

Also, the melting point of tin which is the material of the top edge portion 12, is lower than the melting point of the copper which is the material of the base portion 11. Therefore, in the heating process (refer the FIG. 3D), tin, a material of the top edge portion 12, becomes molten.

At the same time, molten solution of tin becomes a hemisphere shape by surface tension thereof. Then, molten solution of tin solidifies with the hemisphere shape, therefore the top edge portion 12 with the hemisphere shape is obtained without special improvement. Consequently, the top surface 13 of the post electrode 6 is formed into the hemisphere shape easily, furthermore, the semiconductor device 1 having the post electrodes 6 is manufactured easily.

Also, at the interface between the base portion 11 and the top edge portion 12, copper and tin becomes eutectic alloy, connecting strength between the base portion 11 and the top edge portion 12 is improved.

In above described embodiment, copper is used as the material of the base portion 11 and tin is used as the material of the top edge portion 12. But in another embodiment, other metal material can also be used as the metal material of the base portion 11 and top edge portion 12.

In another embodiment, the material of the top edge portion 12 may be any metal material having a melting point lower than that of the material of the base portion 11, for example, alloy including tin can be used as the material of the top edge portion 12. Also, gold can be used as a material of the base portion 11. In the case where a material of the base portion 11 is gold, as a material of the top edge portion 12, a metal material whose melting point is lower than that of gold, like nickel, can be used.

Though the metal ball 7 is arranged on each of the post electrodes 6, the metal ball 7 can be omitted in another embodiment. Even if the metal ball 7 is omitted, since each of the electrodes 6 is protruding from the surface of the sealing resin layer 5, the post electrodes 6 can be connected directly to the pad electrodes of the print circuit board. Thus, mounting (electrical and mechanical connection) on the print circuit board can be accomplished.

A sealing layer which includes silicon can also be used instead of the sealing resin layer 5.

The shape of the top edge face 13 is not limited to the rigid hemispheric shape. The shape of the top edge face 13 may be, for example, a curving face whose top edge is curving.

To avoid the stripping between the post electrode 6 and the metal ball 7, a maximum diameter of the metal ball 7 is smaller than the length which is 1.3 times a length of a chord correspond to an arc formed by the curving face, preferably.

Also, to reduce the height of the semiconductor device 1 mounted on the print circuit board, a distance between the surface of the semiconductor chip 2 and the surface of the sealing resin layer 5 is not longer than 40 μm, preferably.

Also, to avoid the metal ball 7 becomes too large, a length of a chord correspond to an arc formed by the top surface 13 (the curving face) is not bigger than 320 μm, preferably.

While preferred embodiments and examples of the present invention have been described above, it is to be understood that variations and modifications will be apparent to those skilled in the art without departing the scope and spirit of the present invention. The scope of the present invention, therefore, is to be determined solely by the following claims.

This application corresponds to Japanese Patent Application No. 2008-133391 filed with the Japan Patent Office on May 21, 2009, the disclosure of which is incorporated herein by reference.

What is claimed is:

1. A semiconductor device comprising:
   a semiconductor chip;
   a sealing resin layer formed on the semiconductor chip;
   a post electrode formed in a through-hole penetrating through the sealing resin layer in a thickness direction, and having a hemispheric top surface; and
   an external connecting terminal formed on the top surface of the post electrode and protruding from a surface of the sealing resin layer,
   wherein the post electrode comprises a base portion made of a first metal material, and a top edge portion made of a second metal material different from the first metal material and formed on the base portion, and
   wherein a diameter of the base portion and a diameter of the top edge portion at the contact surface between the base portion and the top edge portion are the same size, and
   wherein the first metal material comprises copper and the second metal material comprises tin.

2. The semiconductor device according to claim 1, wherein the base portion is buried in the through-hole, and an interface between the base portion and the top edge portion is positioned at the side of the semiconductor chip with respect to a surface of the sealing resin layer.

3. The semiconductor device according to claim 1, wherein the base portion is formed into a columnar shape, and the top edge portion is formed into a hemispheric shape.

4. The semiconductor device according to claim 1, wherein a melting point of the second metal material is lower than a melting point of the first metal material.

5. The semiconductor device according to claim 1, wherein a center and a top portion of the post electrode protrudes from the surface of the sealing resin layer.

6. The semiconductor device according to claim 1, wherein a maximum diameter of the external connecting terminal is smaller than a length which is 1.3 times the diameter of the post electrode.

7. The semiconductor chip device according to claim 1, wherein a thickness of the sealing resin layer is not greater than 40μm.

8. The semiconductor device according to claim 1, wherein the semiconductor device includes a semiconductor device applied WLCSP (Wafer Level Chip Size Package) technology.

9. The semiconductor device according to claim 1, further comprising a passivation film which protects a surface of the semiconductor chip formed on the semiconductor chip.

10. The semiconductor device according to claim 9, further comprising a rewiring formed on the passivation film.

11. The semiconductor device according to claim 9, wherein the passivation film is made of an oxide silicon or a nitride silicon.

12. The semiconductor device according to claim 10, wherein a pad opening is formed in the passivation film to expose a part of an internal wiring of the semiconductor chip.

13. The semiconductor device according to claim 10, wherein the rewiring is made of copper.

14. The semiconductor device according to claim 1, wherein the sealing resin layer is made of a epoxy resin.

15. The semiconductor device according to claim 10, wherein the sealing resin layer is sealing the passivation film, the rewiring and a surface of the semiconductor device.

16. The semiconductor device according to claim 1, wherein the external connecting terminal is made of solder.

17. The semiconductor device according to claim 1, wherein a base edge portion of the external connecting terminal creeps into a clearance portion between an inner face of the through-hole and the top surface of the post electrode, the base edge portion of the external connecting terminal is hold tight between the inner face of the through-hole and the top surface of the post electrode.

18. The semiconductor device according to claim 1, wherein a side face of the base portion is covered by the sealing resin layer not for being exposed.

19. The semiconductor device according to claim 12, wherein the post electrode having the base portion and the top edge portion is located at a different portion right above the pad opening formed in the passivation film.

20. A semiconductor device, comprising:
a semiconductor chip;
a sealing layer formed on the semiconductor chip; and
a connecting electrode formed in a through-hole penetrating through the sealing resin layer in a thickness direction, and having a curving top surface at a top edge thereof; and
an external connecting terminal formed on the top surface of the connecting electrode and protruding from a surface of the sealing layer,
wherein the connecting electrode comprises a base portion made of a first metal material, and a top edge portion made of a second metal material different from the first metal material and formed on the base portion,
wherein a diameter of the base portion and a diameter of the top edge portion at the contact surface between the base portion and the top edge portion are the same size, and
wherein the first metal material comprises copper and the second metal material comprises tin.

21. The semiconductor device according to claim 20, wherein a part of the base portion is buried in the through-hole, and an interface between the base portion and the top edge portion is positioned at the side of the semiconductor chip with respect to the surface of the sealing layer.

22. The semiconductor device according to claim 20, wherein a melting point of the second metal material is lower than a melting point of the first metal material.

23. The semiconductor device according to claim 20, wherein a maximum diameter of the external connecting terminal is smaller than a length which is 1.3 times a length of a chord corresponding to an arc formed by the curving top surface.

24. The semiconductor chip device according to claim 20, wherein a thickness of the sealing layer is not greater than 40μm.

25. The semiconductor device according to claim 20, wherein a length of a chord corresponding to an arc formed by the curving top surface is not bigger than 320μm.

26. The semiconductor device according to claim 20, further comprising a passivation film which protects a surface of the semiconductor chip formed on the semiconductor chip.

27. The semiconductor device according to claim 26, further comprising a rewiring formed on the passivation film.

28. The semiconductor device according to claim 26, wherein the passivation film is made of an oxide silicon or a nitride silicon.

29. The semiconductor device according to claim 27, wherein a pad opening is formed in the passivation film to expose a part of an internal wiring of the semiconductor chip.

30. The semiconductor device according to claim 27, wherein the rewiring is made of copper.

31. The semiconductor device according to claim 20, wherein the sealing resin layer is made of a epoxy resin.

32. The semiconductor device according to claim 27, wherein the sealing resin layer is sealing the passivation film, the rewiring and a surface of the semiconductor device.

33. The semiconductor device according to claim 20, wherein the external connecting terminal is made of solder.

34. The semiconductor device according to claim 20, wherein a base edge portion of the external connecting terminal creeps into a clearance portion between an inner face of the through-hole and the top surface of the post electrode, the base edge portion of the external connecting terminal is hold tight between the inner face of the through-hole and the top surface of the post electrode.

35. The semiconductor device according to claim 20, wherein a side face of the base portion is covered by the sealing resin layer not for being exposed.

36. The semiconductor device according to claim 29, wherein the post electrode having the base portion and the top edge portion is located at a different portion right above the pad opening formed in the passivation film.

37. A semiconductor device comprising:
a semiconductor chip;
a sealing resin layer formed on the semiconductor chip;
a post electrode formed in a through-hole penetrating through the sealing resin layer in a thickness direction, and having a hemispheric top surface; and
an external connecting terminal formed on the top surface of the post electrode and protruding from a surface of the sealing resin layer,
wherein the post electrode comprises a base portion made of a first metal material, and a top edge portion made of a second metal material different from the first metal material and formed on the base portion, and wherein a diameter of the base portion and a diameter of the top edge portion at the contact surface between the base portion and the top edge portion are the same size, wherein a melting point of the second metal material is lower than a melting point of the first metal material, and wherein the first metal material and the second metal material becomes eutectic alloy at the connecting face between the base portion and the top edge portion.

38. A semiconductor device, comprising:
a semiconductor chip;
a sealing layer formed on the semiconductor chip;
a connecting electrode formed in a through-hole penetrating through the sealing resin layer in a thickness direction, and having a curving top surface at a top edge thereof; and
an external connecting terminal formed on the top surface of the connecting electrode and protruding from a surface of the sealing layer,
wherein the connecting electrode comprises a base portion made of a first metal material, and a top edge portion made of a second metal material different from the first metal material and formed on the base portion,
wherein a diameter of the base portion and a diameter of the top edge portion at the contact surface between the base portion and the top edge portion are the same size,
wherein a melting point of the second metal material is lower than a melting point of the first metal material, and
wherein the first metal material and the second metal material becomes eutectic alloy at the connecting face between the base portion and the top edge portion.

39. A semiconductor device, comprising:
a semiconductor chip;
a sealing layer formed on the semiconductor chip;
a connecting electrode formed in a through-hole penetrating through the sealing resin layer in a thickness direction, and having a curving top surface at a top edge thereof, the connecting electrode includes a base portion and a top edge portion formed on the base portion; and
an external connecting terminal formed on the top surface of the connecting electrode and protruding from a surface of the sealing layer,
wherein a base edge portion of the external connecting terminal is held tight between an inner face of the through-hole and the curving top surface of the connecting electrode,
wherein the base is made of a first metal material, and the top edge portion is made of a second metal material which differs from the first metal material, and
wherein the first metal material comprises copper and the second metal material comprises tin.

40. The semiconductor device according to claim 39, wherein a diameter of the base portion and a diameter of the top edge portion are the same size.

41. The semiconductor device according to claim 39, wherein a part of the base portion is buried in the through-hole, and an interface between the base portion and the top edge portion is positioned at the the side of the semiconductor chip with respect to the surface of the sealing layer.

42. The semiconductor device according to claim 39, wherein a melting point of the second metal material is lower than a melting point of the first metal material.

43. The semiconductor device according to claim 39, wherein a maximum diameter of the external connecting terminal is smaller than a length which is 1.3 times the diameter of the connecting electrode.

44. The semiconductor chip device according to claim 39, wherein a thickness of the sealing layer is not greater than 40 μm.

45. The semiconductor device according to claim 39, wherein a length of a chord corresponding to an arc formed by the curving top surface is not bigger than 320 μm.

46. The semiconductor device according to claim 39, wherein the semiconductor device includes a semiconductor device applied WLCSP (Wafer Level Chip Size Package) technology.

47. The semiconductor device according to claim 39, further comprising a passivation film which protects a surface of the semiconductor chip formed on the semiconductor chip.

48. The semiconductor device according to claim 47, further comprising a rewiring formed on the passivation film.

49. The semiconductor device according to claim 47, wherein the passivation film is made of an oxide silicon or a nitride silicon.

50. The semiconductor device according to claim 47, wherein a pad opening is formed in the passivation film to expose a part of an internal wiring of the semiconductor chip.

51. The semiconductor device according to claim 48, wherein the rewiring is made of copper.

52. The semiconductor device according to claim 39, wherein the sealing resin layer is made of a epoxy resin.

53. The semiconductor device according to claim 48, wherein the sealing resin layer is sealing the passivation film, the rewiring and a surface of the semiconductor device.

54. The semiconductor device according to claim 39, wherein the external connecting terminal is made of solder.

55. The semiconductor device according to claim 39, wherein a side face of the base portion is covered by the sealing resin layer not for being exposed.

56. The semiconductor device according to claim 50, wherein the post electrode having the base portion and the top edge portion is located at a different portion right above the pad opening formed in the passivation film.

57. A semiconductor device, comprising:
a semiconductor chip;
a sealing layer formed on the semiconductor chip;
a connecting electrode formed in a through-hole penetrating through the sealing resin layer in a thickness direction, and having a curving top surface at a top edge thereof, the connecting electrode includes a base portion and a top edge portion formed on the base portion; and
an external connecting terminal formed on the top surface of the connecting electrode and protruding from a surface of the sealing layer,
wherein a base edge portion of the external connecting terminal is held tight between an inner face of the through-hole and the curving top surface of the connecting electrode,
wherein the base is made of a first metal material, and the top edge portion is made of a second metal material which differs from the first metal material, and
wherein the first metal material and the second metal material becomes eutectic alloy at the connecting face between the base portion and the top edge portion.

58. A semiconductor device, comprising:
a semiconductor chip;
a rewiring formed above the semiconductor chip;
a sealing layer formed on the semiconductor chip;
a connecting electrode formed in a through-hole penetrating through the sealing resin layer in a thickness direction, and having a curving top surface at a top edge thereof, the connecting electrode includes a base portion made of a first metal material and a top edge portion made of a second metal material; and an external connecting terminal formed on the top surface of the connecting electrode and protruding from a surface of the sealing layer, wherein the first metal material and the second metal material differ from each other, and wherein the first metal material comprises copper and the second metal material comprises tin.

59. The semiconductor device according to claim 58, wherein a diameter of the base portion and a diameter of the top edge portion at the contact surface between the base portion and the top edge portion are the same size.

60. The semiconductor device according to claim 58, wherein a part of the base portion is buried in the through-hole, and an interface between the base portion and the top edge portion is positioned at the side of the semiconductor chip with respect to the surface of the sealing layer.

61. The semiconductor device according to claim 58, wherein a melting point of the second metal material is lower than a melting point of the first metal material.

62. The semiconductor device according to claim 58, wherein a maximum diameter of the external connecting terminal is smaller than a length which is 1.3 times the diameter of the connecting electrode.

63. The semiconductor chip device according to claim 58, wherein a thickness of the sealing layer is not greater than 40 μm.

64. The semiconductor device according to claim 58, wherein a length of a chord corresponding to an arc formed by the curving top surface is not bigger than 320 μm.

65. The semiconductor device according to claim 58, wherein the semiconductor device includes a semiconductor device applied WLCSP (Wafer Level Chip Size Package) technology.

66. The semiconductor device according to claim 58, further comprising a passivation film which protects a surface of the semiconductor chip formed on the semiconductor chip.

67. The semiconductor device according to claim 58, wherein the passivation film is made of an oxide silicon or a nitride silicon.

68. The semiconductor device according to claim 66, wherein a pad opening is formed in the passivation film to expose a part of an internal wiring of the semiconductor chip.

69. The semiconductor device according to claim 58, wherein the rewiring is made of copper.

70. The semiconductor device according to claim 58, wherein the sealing resin layer is made of a epoxy resin.

71. The semiconductor device according to claim 58, wherein the sealing resin layer is sealing the passivation film, the rewiring and a surface of the semiconductor device.

72. The semiconductor device according to claim 58, wherein the external connecting terminal is made of solder.

73. The semiconductor device according to claim 58, wherein a side face of the base portion is covered by the sealing resin layer not for being exposed.

74. The semiconductor device according to claim 68, wherein the post electrode having the base portion and the top edge portion is located at a different portion right above the pad opening formed in the passivation film.

75. The semiconductor device according to claim 58, wherein a base edge portion of the external connecting terminal creeps into a clearance portion between an inner face of the through-hole and the top surface of the post electrode, the base edge portion of the external connecting terminal is hold tight between the inner face of the through-hole and the top surface of the connecting electrode.

76. A semiconductor device, comprising:

a semiconductor chip;

a rewiring formed above the semiconductor chip;

a sealing layer formed on the semiconductor chip;

a connecting electrode formed in a through-hole penetrating through the sealing resin layer in a thickness direction, and having a curving top surface at a top edge thereof, the connecting electrode includes a base portion made of a first metal material and a top edge portion made of a second metal material; and an external connecting terminal formed on the top surface of the connecting electrode and protruding from a surface of the sealing layer, wherein the first metal material and the second metal material differ from each other, and wherein the first metal material and the second metal material becomes eutectic alloy at the connecting face between the base portion and the top edge portion.

* * * * *